United States Patent
Deschamps

(10) Patent No.: US 7,897,906 B2
(45) Date of Patent: Mar. 1, 2011

(54) DOUBLE QUENCH CIRCUIT FOR AN AVALANCHE CURRENT DEVICE

(75) Inventor: Pierre D. Deschamps, Coteau-du-lac (CA)

(73) Assignee: Excelitas Canada Inc., Vaudreuil, Quebec (CA)

( * ) Notice: Subject to any disclaimer, the term of this patent is extended or adjusted under 35 U.S.C. 154(b) by 471 days.

(21) Appl. No.: 11/726,847

(22) Filed: Mar. 23, 2007

(65) Prior Publication Data

US 2008/0231339 A1 Sep. 25, 2008

(51) Int. Cl.
*H01J 40/14* (2006.01)

(52) U.S. Cl. .................. 250/214 R; 250/214.1

(58) Field of Classification Search ............. 250/214 R, 250/214.1, 214 LA, 214 AG, 214 RC; 327/309–326, 327/514, 515, 502
See application file for complete search history.

(56) References Cited

U.S. PATENT DOCUMENTS

| | | | |
|---|---|---|---|
| 4,303,861 A * | 12/1981 | Ekstrom | 250/370.14 |
| 4,945,227 A | 7/1990 | Jones et al. | |
| 4,963,727 A * | 10/1990 | Cova | 250/214 R |
| 5,532,474 A | 7/1996 | Dautet et al. | |
| 5,933,042 A | 8/1999 | Trottier et al. | |
| 6,384,663 B2 | 5/2002 | Cova et al. | |

OTHER PUBLICATIONS

International Preliminary Report on Patentability for International Application No. PCT/CA2008/000529, mailed Oct. 8, 2009, 9 pages (unnumbered).

* cited by examiner

*Primary Examiner*—Que T Le
(74) *Attorney, Agent, or Firm*—Iandiorio Teska & Coleman

(57) ABSTRACT

A double quench circuit for an avalanche current device is provided in which the circuit includes an avalanche current device having a first terminal responsive to a bias voltage to reverse bias the avalanche current device above its avalanche breakdown voltage. A first quench circuit is responsive to the bias voltage and coupled to the first terminal of the avalanche device for reducing the amount of the avalanche current passing through the avalanche device. A second quench circuit is coupled to a second terminal of the avalanche device for reducing the amount of the avalanche current passing through the avalanche device.

24 Claims, 5 Drawing Sheets

DOUBLE QUENCH CIRCUIT FOR AN AVALANCHE CURRENT DEVICE

FIELD OF THE INVENTION

This invention relates to a double quench circuit for an avalanche current device, and more particularly to passive and active quench circuits for avalanche photodiodes.

BACKGROUND OF THE INVENTION

Photodiodes convert light into electricity and thus can be used to detect light levels. An avalanche photodiode (APD) is a semiconductor device that can detect extremely low levels of electromagnetic radiation. Unlike a PIN photodiode, which generally produces a single electron for each photon received, an APD is constructed so that an electron dislodged by a photon will hit other atoms in the APD semiconductor lattice with sufficient velocity and energy so that additional hole-electron pairs are created by the collisions. Typically a free electron will create a number of hole-electron pairs, and the electrons from these pairs will, in turn, create additional electrons, thus creating an "avalanche" process. This multiplication of the electrons gives the APD an effective gain and allows the detection of very low light levels.

Advances in the fabrication and performance of the avalanche photodiodes have led to their use in the detection of individual photons and other short-duration events. When used in the single photon detection applications, APD's are frequently used in "Geiger" mode in which the APD is reverse biased to a voltage that exceeds its breakdown voltage. In geiger mode, some means is necessary to stop or "quench" the current flowing through the diode after each avalanche.

One method to quench the current is to limit the maximum current flowing through the diode, by means of a passive series resistor, to a low enough level that the current will spontaneously cease due to the statistical nature of the avalanche process. While using this circuitry, the minimum interval between detectable events is limited by the so-called "dead time": the time required to turn off the diode completely and to recharge it, and any other parasitic or intrinsic capacitance associated with the diode, through the typically large current limiting resistor which results in a large RC time constant.

A so-called passive quench circuit is reverse biased through a biasing means such as a series resistance by applying a high voltage, $V_{RB}$, comprised of the breakdown voltage, $V_{BR}$, plus the overvoltage $\Delta V$ across the avalanche device. When an event such as a thermodynamically generated electron or impingement of a photon occurs in the case of an avalanche photodiode, the avalanche current begins to flow, the junction between the resistance means for biasing and the avalanche photodiode rises toward $\Delta V$, and the voltage across the photodiode approaches the breakdown voltage $V_{BR}$. Eventually the voltage at the junction stanches the avalanche current. The system will only reach full sensitivity when the discharge is completed and reset in the time dictated by the RC time constant which is typically long.

To shorten the resetting time, active quench circuits were developed which, for example, may use a comparator to sense the onset of an avalanche current and through the action of a monostable circuit, and apply a voltage of $\Delta V$ plus an excess voltage $V_X$ to the junction of the biasing resistor and avalanche photodiode to drive it safely below $V_{BR}$ and stop the avalanche current. And, after a short delay, typically applied through another monostable circuit, a switch is closed to ground from that junction to quickly recharge the intrinsic capacitance of the avalanche photodiode. Although this reduces the "dead time" by circumventing the RC time constant delay suffered by the passive quench circuits, it may introduce parasitic or intrinsic capacitance. This additional capacitance increases the charge flow through the avalanche diode and adds to the heating effect too. Additionally, the use of a traditional active quench circuit can also be disadvantageous since it creates a time delay in the circuit. Thus, the using an active quench circuit on both the anode and cathode sides of an APD is not typically desirable. Two examples of an active quench circuit are shown in U.S. Pat. Nos. 5,532,474 and 5,933,042, both incorporated herein by reference.

BRIEF SUMMARY OF THE INVENTION

It is therefore an object of this invention to provide a double quench circuit for an avalanche current device.

It is a further object of this invention to provide such a double quench circuit which provides a faster reset of the avalanche device.

It is a further object of this invention to provide such a double quench circuit which reduces the after pulsing of the avalanche device.

It is a further object of this invention to provide such a double quench circuit which reduces heating of the avalanche current device.

It is a further object of this invention to provide such a double quench circuit which increases the maximum count rate of the avalanche device.

It is a further object of this invention to provide such a double quench circuit which increases the linearity of the avalanche current.

The invention results from the realization that a more effective quench circuit for an avalanche current device which resets the device faster and reduces the after pulsing and the heat dissipation by the device is effected by a double quench circuit with a quench circuit on both the high voltage and the low voltage sides of the device. Typically, the avalanche current device is an avalanche photodiode.

This invention features a double quench circuit for an avalanche current device, the circuit comprising, an avalanche current device having a first terminal responsive to a bias voltage to reverse bias the avalanche current device above its avalanche breakdown voltage, a first quench circuit responsive to the bias voltage and coupled to the first terminal of the avalanche device for reducing the amount of the avalanche current passing through the avalanche device and a second quench circuit coupled to a second terminal of the avalanche device for reducing the amount of the avalanche current passing through the avalanche device.

In a preferred embodiment, the double quench circuit may further include a detection circuit responsive to avalanche current of the avalanche current device for detecting the avalanche current and generating an output signal in response thereto the second quench circuit including an active quench circuit responsive to the output signal of the detection circuit for raising the voltage of the second terminal of the avalanche device and reducing the avalanche breakdown voltage to quench the avalanche current of the avalanche device. The second quench circuit may include a switch configured to couple a second voltage to the second terminal to raise the voltage of the second terminal. The detection circuit may include a comparator configured to compare the voltage of the second terminal with a reference voltage and output a signal when the voltage of the second terminal exceeds the reference voltage. The detection circuit may include a delay circuit responsive to the comparator and configured to delay the output of the comparator provided to the second quench circuit. The first quench circuit may include a passive quench circuit. The passive quench circuit may include one or more resistors. The double quench circuit may further include a first active reset circuit responsive to the output signal of the detection circuit, said active reset circuit configured to couple the first terminal to the voltage source to recharge the avalanche device above its avalanche breakdown voltage to reset the avalanche device. The first active reset circuit may include a switch connected between the voltage source and the first terminal. The switch may include a transistor. The double quench circuit may further include a second active reset circuit responsive to the output signal of the detection circuit and connected to a second terminal of the avalanche device, said second active reset circuit configured to couple the second terminal to a third voltage to recharge the avalanche device above its avalanche breakdown voltage to reset the avalanche device. The third voltage may be ground and the second active reset circuit may include a switch connected between ground and the second terminal. The switch may include a MOSFET transistor. The double quench circuit may further include a buffer circuit responsive to the second terminal, the delay circuit and the second quench circuit and configured to transfer signals between the second terminal and both the delay circuit and the second quench circuit. The avalanche device may be an avalanche photodiode.

The invention also features a double quench circuit for an avalanche photodiode (APD), the circuit comprising, an avalanche photodiode having a cathode responsive to a bias voltage to reverse bias the APD above its avalanche breakdown voltage, a detection circuit responsive to avalanche current of the APD for detecting the avalanche current and generating an output signal in response thereto, a passive quench circuit responsive to the bias voltage and coupled to the cathode of the APD for reducing the amount of the avalanche current passing through the APD and an active quench circuit responsive to the detection circuit and coupled to the anode of the APD for reducing the avalanche breakdown voltage to quench the avalanche current of the avalanche.

In a preferred embodiment, the active quench circuit may include a switch configured to couple a second voltage to the anode to raise the voltage of the anode. The passive quench circuit may include one or more resistors. The double quench circuit may further include a first active reset circuit responsive to the output signal of the detection circuit, said active reset circuit configured to couple the cathode to the voltage source to recharge the APD above its avalanche breakdown voltage to reset the APD. The first active reset circuit may include a switch connected between the voltage source and the anode. The double quench circuit may further include a second active reset circuit responsive to the output signal of the detection circuit and connected to the anode of the avalanche device, said second active reset circuit configured to couple the anode to a third voltage to recharge the avalanche device above its avalanche breakdown voltage to reset the avalanche device. The third voltage may be ground and the second active reset circuit may include a switch connected between ground and the anode.

The invention also features a double quench circuit for an avalanche photodiode (APD), the circuit comprising, an avalanche photodiode having a cathode responsive to a bias voltage to reverse bias the APD above its avalanche breakdown voltage, a detection circuit including a comparator responsive to avalanche current of the APD and a reference voltage for detecting the avalanche current and generating an output signal in response thereto, a passive quench circuit including one or more resistors responsive to the bias voltage and coupled to the cathode of the APD for reducing the amount of the avalanche current passing through the APD, an active quench circuit responsive to the detection circuit and coupled to the anode of the APD for reducing the avalanche breakdown voltage to quench the avalanche current of the avalanche, a first active reset circuit responsive to the output signal of the detection circuit, said active reset circuit configured to couple the cathode to the voltage source to recharge the APD above its avalanche breakdown voltage to reset the APD and a second active reset circuit responsive to the output signal of the detection circuit and connected to the anode of the avalanche device, said second active reset circuit configured to couple the anode to a third voltage to recharge the avalanche device above its avalanche breakdown voltage to reset the avalanche device.

The subject invention, however, in other embodiments, need not achieve all these objectives and the claims hereof should not be limited to structures or methods capable of achieving these objectives.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
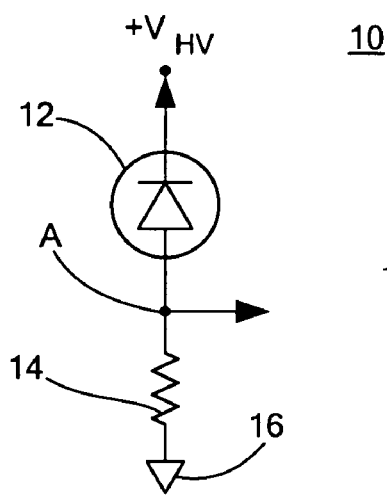
FIG. 1 is a schematic diagram of a prior art passive quench circuit for an avalanche photodiode.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 one prior art passive quench circuit 10 including an avalanche diode 12 and a biasing resistor 14. Resistor 14 is connected at junction A to the anode of avalanche device 12 and at its other end connected to ground 16. The cathode of avalanche current device 12 is connected to a high voltage $V_{HV}$ which applies the breakdown voltage $V_{BR}$ across avalanche device 12. Avalanche device 12 typically is an avalanche diode or an avalanche photodiode in which the avalanche current can be triggered either by photon impingement or by thermal energy.

Figure 2:
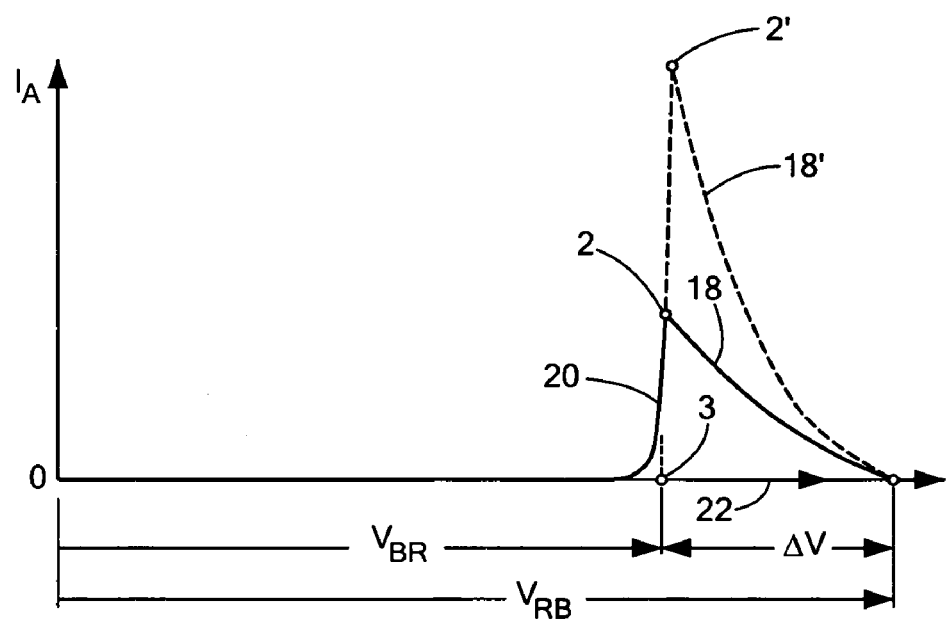
FIG. 2 is an illustration of the characteristic avalanche current during an avalanche and quench operation for the circuit of FIG. 1.

The voltage applied across avalanche device 12 is the reverse bias voltage $V_{+HV}$ which is a combination of the breakdown voltage $V_{BR}$, FIG. 2, plus $\Delta V$. Initially, no current is flowing through the avalanche device 12. Upon impingement of a photon or the introduction of thermal energy, the avalanche process begins and the current increases along path 20 to point 2. At this point the avalanche current flowing through resistance 14 has increased the voltage at point A in FIG. 1 from ground to $\Delta V$ so that the voltage across avalanche device 12 is at the breakdown voltage $V_{BR}$. The avalanche current now stops and the current goes to zero as shown at point 3. The avalanche current has now been stanched and the current decreases to point 3. The system now resets from point 3 back to point 1 along the path 22 in a period of time dictated by the RC constant which is determined by the resistance of resistor 14 and the capacitance of the avalanche device 12. During this time, no other photon impingements will be detected. The path 18 from point 1 to point 2 actually depends upon the magnitude of the resistance 14. For a relatively large resistance the current is smaller; for a relatively small resistance, as shown by path 18', the current is larger. If this resistance is too small then the current never stops. This phenomena, well known in the art, is called the latch up effect.

Figure 3:
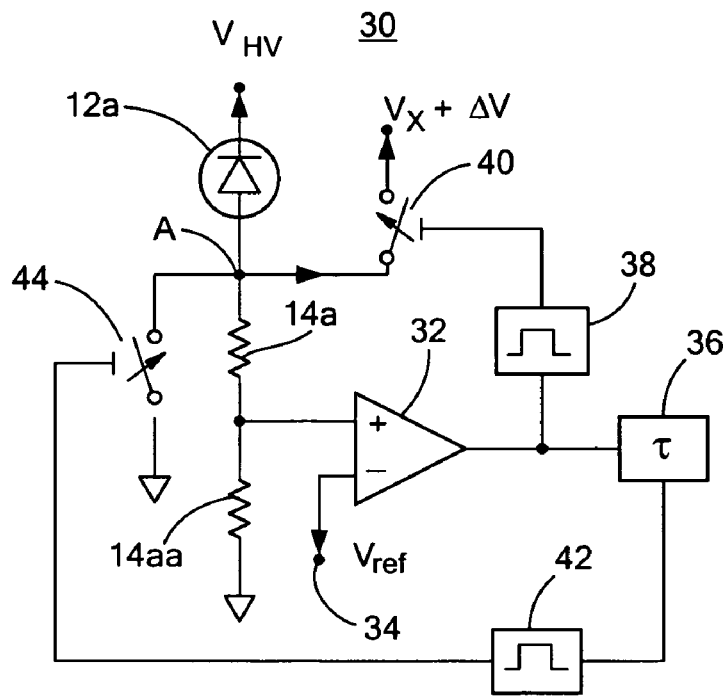
FIG. 3 is a schematic diagram of a prior art active quench circuit for an avalanche diode.

One example of a prior art active quench circuit 30, FIG. 3, uses a comparator 32 to sense the voltage through biasing resistors 14a, 14aa, with respect to a reference input 34. When the comparison suggests that an avalanche current is beginning to flow, comparator 32 provides an output to delay line 36 and to monostable circuit 38. Monostable 38 provides a momentary pulse to close switch 40 and apply a voltage $V_X+\Delta V$ to point A to quickly reduce the voltage from the reverse bias voltage $V_{+HV}$ to and below the breakdown voltage $V_{+HV}$. This stanches the avalanche current and stops the avalanche process. Meanwhile, after a short delay, delay circuit 36 actuates monostable circuit 42 to provide a momentary pulse to switch 44 to reset the circuit and recharge avalanche diode 12a.

Figure 4:
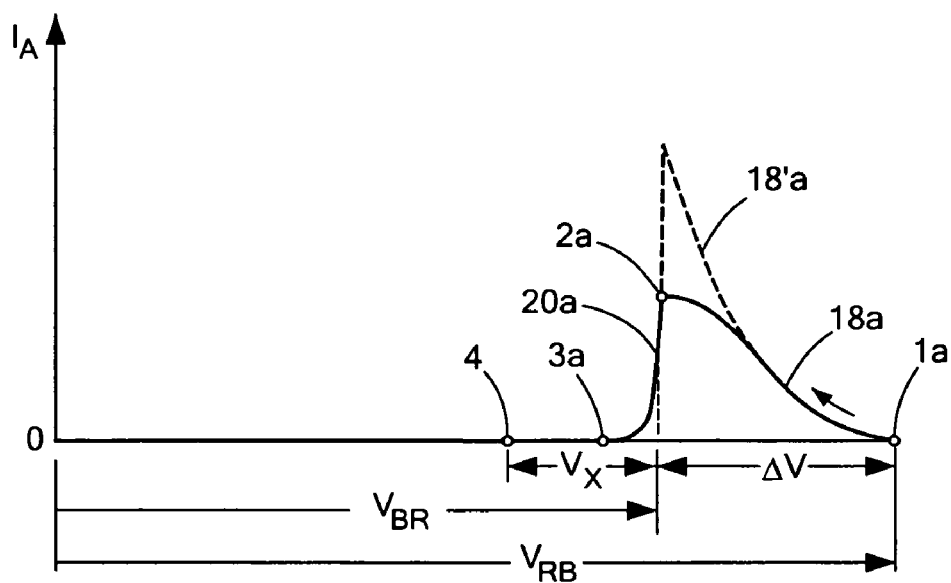
FIG. 4 is a graph of the characteristic avalanche current during an avalanche and quench operation for the circuit of FIG. 3.

This cycle of operation is depicted in FIG. 4, where the circuit starts out at point 1a with the voltage applied being the reverse bias voltage $V_{BR}$. Assuming once again that avalanche device 12a is an avalanche photodiode and a photon has impinged upon it, the avalanche current begins and tracks along the path 18a, FIG. 4. Normally this would continue along path 18'a, but when comparator 32 detects that this current has begun to flow it actuates the monostable vibrator 30 to close switch 40 and apply $\Delta V$ and the excess voltage $V_X$ to junction A. This causes the path to follow the full line course and arrive at point 2a as the voltage drops an amount $\Delta V$ to the breakdown voltage $V_{BR}$. The action continues and the current and the voltage decrease along the path 20a to point 3 and beyond to point 4 where the quench is completed. At this point the system is reset by the action of timer 36, monostable circuit 42 and switch 44 so the system once again returns to point 1a.

Figure 5:
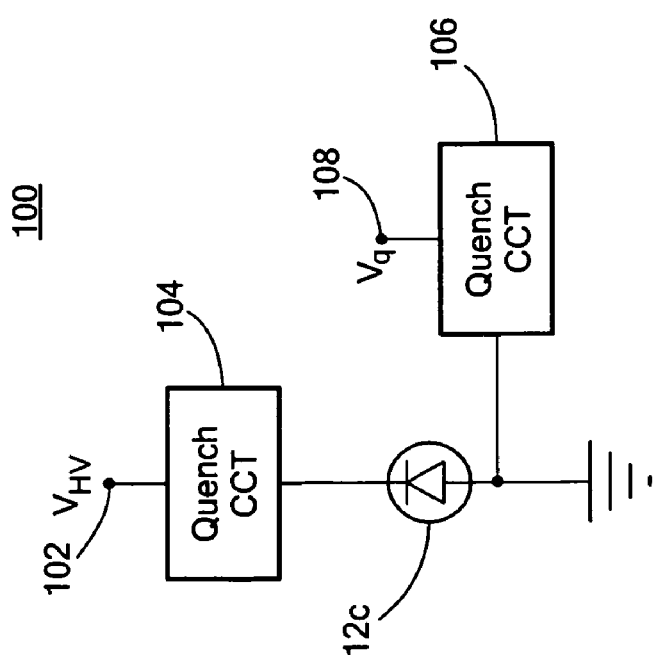
FIG. 5 is a schematic block diagram of an example of a double quench circuit for an avalanche photodiode according to this invention.

To decrease the reset time or "dead time" of the avalanche device, in accordance with this invention active quench circuit 100, FIG. 5, includes an avalanche device such as an avalanche diode or avalanche photodiode (APD) 12c, high voltage source $V_{hv}$, first quench circuit 104, and second quench circuit 106. Preferably, the avalanche device is an APD. First quench circuit 104 may be an inactive or passive quench circuit but is preferably a passive quench circuit that includes one or more resistors in series with voltage source 102 and APD 12c. Second quench circuit 106 is preferably an active quench circuit that reduces the amount of the avalanche current passing through the avalanche device.

Quench circuit 104 is responsive to bias voltage from voltage source 102 and is coupled to a first terminal, i.e., the cathode, of APD 12c. In operation, when light impinges on APD 12c sufficient to begin an avalanche current, quench circuit 104 reduces the amount of avalanche current passing through APD 12c to ground. Quench 106 is coupled to the second terminal, i.e. the anode, of APD 12c and also reduces the amount of the avalanche current passing through the avalanche device. If quench circuit 106 is an active quench circuit, it can be responsive to a second voltage source Vq 108 to provide a positive voltage to the anode of APD 12c at a time when avalanche current is flowing through the APD, thereby counteracting the current flow through the APD. Preferably, quench circuit 104 is a passive quench circuit and quench circuit 106 is an active quench circuit. In this manner, the time required to turn off APD 12c and recharge it is not excessive and there significant delays in resetting APD 12c which may be the case if more than one active quench circuit is used in circuit 100.

Figure 6:
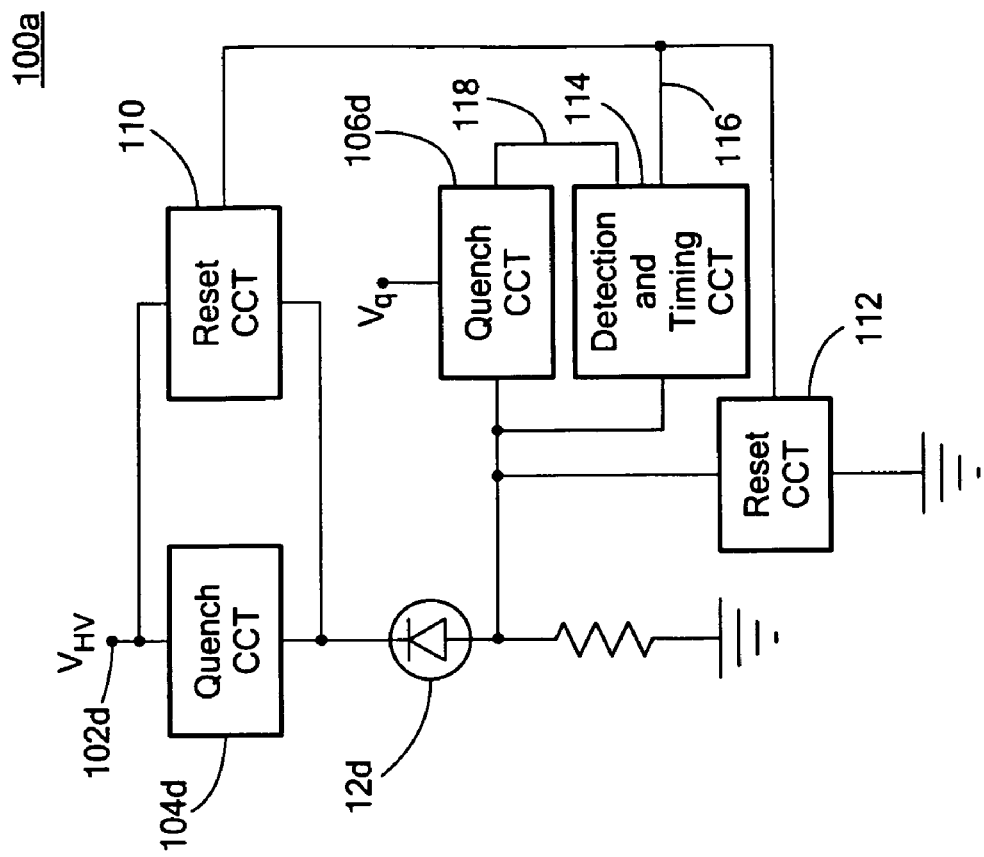
FIG. 6 is a schematic block diagram of another embodiment of a double quench circuit for an avalanche photodiode according to this invention.

Double quench circuit 100a, FIG. 6, may also include first and second reset circuits 110 and 112, both of which are responsive to a detection and timing circuit 114. Reset circuit 110 is configured to couple the cathode of APD 12d to voltage source 102a to recharge APD 12d above its avalanche breakdown voltage to reset the APD. Reset circuit 110 may be a switch connected between voltage source 102a and the cathode of APD 12d. Reset circuit 112 is connected to the anode of APD 12d and is configured to couple the anode of the APD to a low voltage such as ground to quickly recharge APD above its avalanche breakdown voltage to reset the APD. Reset circuit 122 may also include a switch to couple the anode of APD 12d to the ground.

Detection and timing circuit 114 is responsive to the avalanche current of APD 12d and provides a delay signal on line 116 to reset circuits 110 and 112 to delay the resetting of the APD. Detection and timing circuit 114 also provides a delay signal to quench circuit 106a to delay the quenching of the APD. If quench circuit 104a is passive and quench circuit 1a is active as preferred, quench circuit 104a will reduce the maximum amount of avalanche current flowing through APD 12d and the active quench circuit 106a will reduce the amount of avalanche current flowing through APD 12d after a delay provided by detection and timing circuit 114. Also, reset circuits 110 and 112 will further reduce the dead time of APD 12d when they are activated after the delay provided by detection and timing circuit 114.

Figure 7:
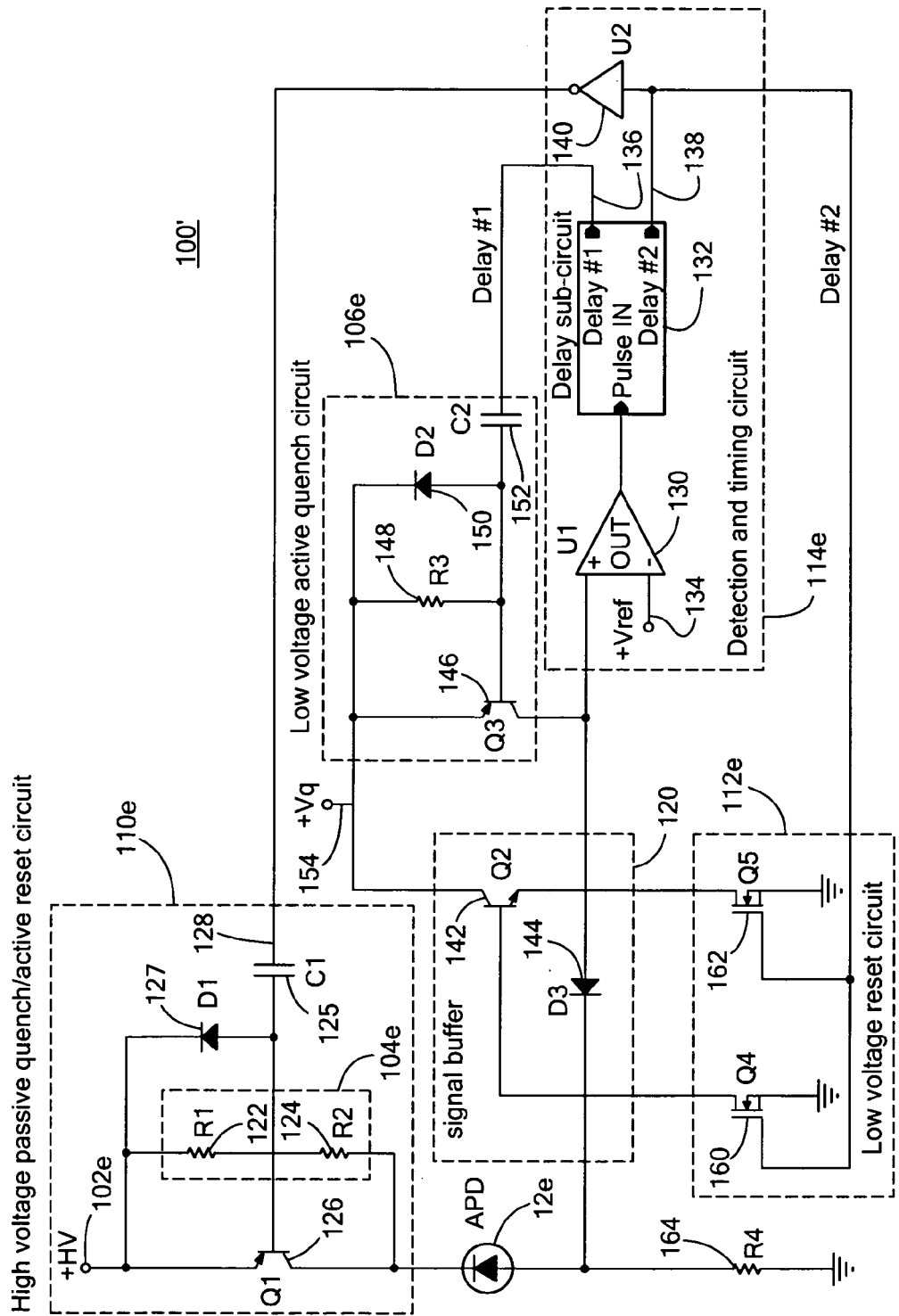
FIG. 7 is a more detailed schematic circuit diagram of the double quench circuit of FIG. 6.

In a typical example, double quench circuit 100', FIG. 7, includes passive quench circuit 104e, active quench circuit 106e, detection and timing circuit 114e, active reset circuits 110e and 112e and signal buffer 120. Passive quench circuit 104e includes resistors 122 and 124 that reduce the maximum amount of current flow from high voltage source 102e through APD 12e.

Resistors 122 and 124 are also part of reset circuit 110e and serve to bias PNP transistor to be normally off. To accomplish this, the value of resistor 122 is relatively small in comparison to the value of resistor 124. For example the value of resistor 122 may be 300 ohms whereas the value of resistor 124 may have a much larger value of 100K ohms. These value of resistances will ensure that resistor 122 will have a sufficiently low value of voltage to keep transistor 126 from normally being biased in an on state. However, as described in more detail below, if detection and timing sub-circuit 114e produces a negative signal on line 128 through capacitor 125, the negative voltage reverse biases diode 130 and provides a voltage sufficient to turn on transistor 126, thereby creating a low resistance path from high voltage 102e to APD 12e to reset the APD.

Detection and timing circuit 114e includes comparator 130 and delay circuit 132. Comparator 130 is responsive to both the avalanche current from the anode of APD 12e and also to reference voltage 134. When the avalanche current exceeds the reference voltage on line 134, comparator 130 outputs a positive signal to delay circuit 132. After a time delay which may typically be around 5 ns, delay circuit of 132 outputs a negative signal to active quench circuit 106e. A delay sub-circuit also outputs a positive signal on line 138 after a second delay which typically is in the range of 5 ns to 50 ns. The second delay is preferably variable so that it can be adjusted to customer requirements. The delay signal on line 138 is output to reset circuit 112e and is also inverted to produce a negative signal by inverter 140 which outputs the negative signal to reset circuit 110e.

To buffer the avalanche current from the anode of APD 12e, signal buffer 120 is used, which includes transistor 142 in a follower configuration to provide a current gain, and diode 144 to transfer positive signal active quench circuit 106e to the anode of APD 12e.

Active quench circuit 106e includes PNP transistor 146, resistor 148, diode 150 and capacitor 152. Resistor 148 is configured to normally keep transistor 146 biased in an off state. When delay circuit 132 outputs a low signal on line 136, diode 150 is reversed biased which produces a voltage sufficient to bias PNP transistor 146 in an on state. When transistor 146 is biased on, the voltage from voltage source Vq 154 turns on diode 144 and current flows from voltage source Vq 154 through transistor 146, diode 144 and resistor 164 to raise the voltage at the anode of APD 12e and quench the avalanche current from the APD.

Reset circuit 112e is also responsive to delay circuit 132 and receives a delay signal on line 138 from the delay circuit. In response to the delay signal, reset circuit 112e turns on 2 MOSFET transistors 160 and 162 to provide a low resistance path between the anode of APD 12e and ground. Transistor 160 and 162 also serve to turn off diode 144 such that current no longer flows from voltage source 154 through active quench circuit 106e.

When delay circuit 132 outputs a positive signal to reset circuit 110e on line 138, inverter 140 produces a negative signal on line 128, which reverse biases diode 127 and biases transistor 126 in an on state. Transistor 126 is configured such that it is biased in an on state, it couples high voltage source 102e to the cathode of APD 12e to quickly recharge the APD above its avalanche breakdown voltage to reset the APD.

Passive quench resistor 164 further quenches the maximum value of the avalanche current flowing through APD 12e, and further provides a voltage sufficient to turn on transistor 142 and to provide comparator 130 with a voltage to determine if an avalanche current is flowing through APD 12e. The values of resistor 164 and reference voltage 134 are chosen such that comparator 130 produces a positive output at a desired time.

Figure 8:
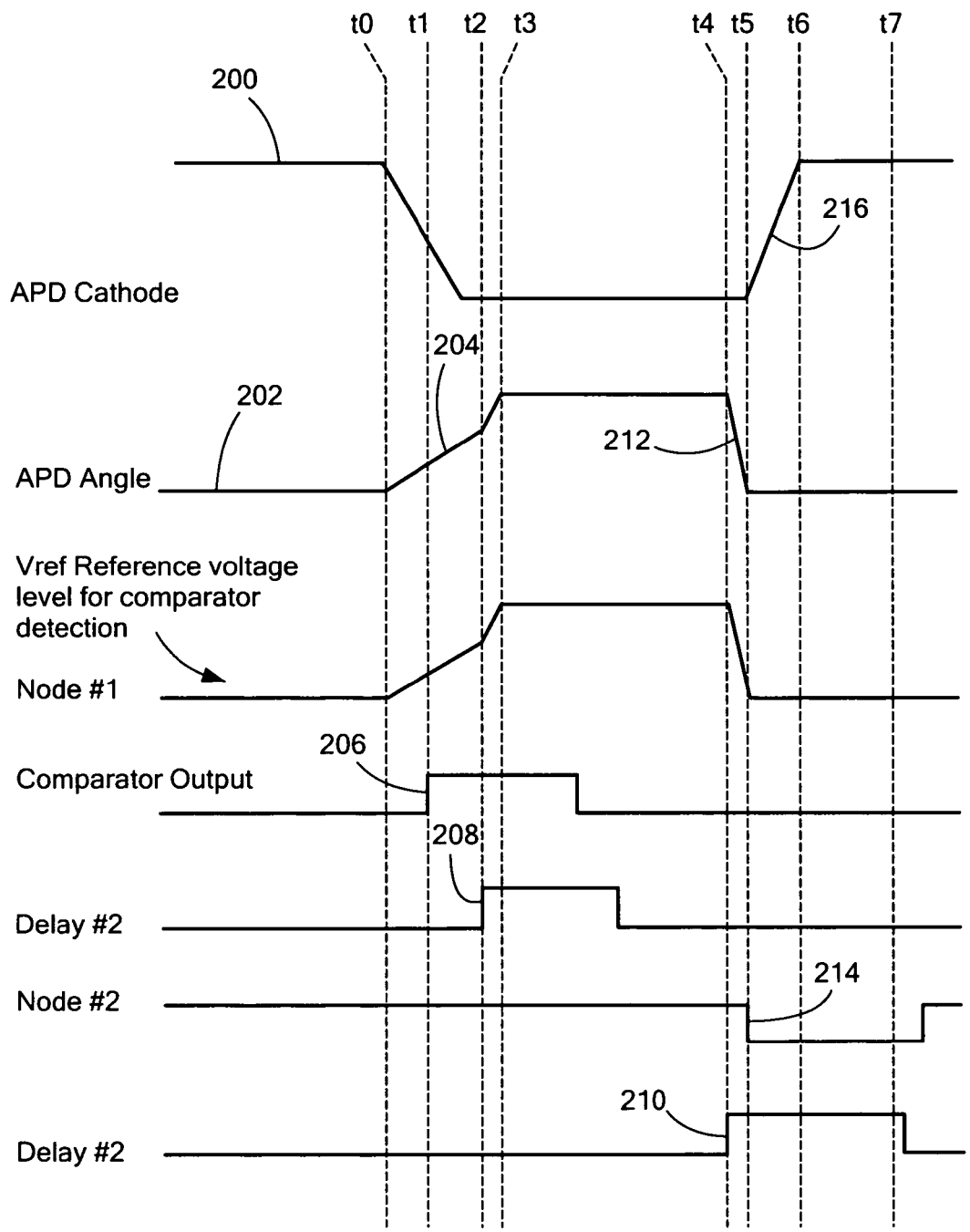
FIG. 8 is a timing diagram for the double quench circuit of FIG. 7.

Reference is now made to FIGS. 7 and 8 to describe the operation of double quench circuit 100'. Before T0, FIG. 8, high voltage source 102e produces a high voltage at the cathode of APD 12e, shown at point 200, FIG. 8, and low voltage at its anode, shown at point 202, since the APD is not biased on to produce an avalanche current. After T0, APD 12e starts to produce an avalanche current, shown at point 204. At this time, resistors 122 and 124 in passive quench circuit 104e and resistor 164 are passively quenching the current of the APD to reduce the maximum avalanche current. At time T1, comparator 130 detects the avalanche current and outputs a positive signal shown at point 206. At time T2, delay circuit 132 outputs a negative signal on line 136 to active quench circuit 106e. This delay signal is shown at point 208, FIG. 8. In response to the delay signal on line 136, transistor 146 is biased on and raises the low voltage side of APD 12e to bias the APD below the breakdown voltage. Between times T3 and T4, the bias voltage of APD 12e is held below the breakdown voltage to quench the APD. At time T4, delay circuit 132 produces a positive signal on line 138 shown at point 210, to actively reset the low voltage side of APD 12e using reset circuit 112e. As it can be seen between times T4 and T5, the active reset of low voltage side of APD 12e decreases the voltage of the APD anode significantly as shown at point 212. After a brief delay caused by inverter 140, at time T5 a low signal appears on line 128 to actively reset the high voltage side of APD 12e using active reset circuit 110e. The result of the signal shown at point 214 produces a large increase in the voltage on the cathode side of APD 12e as shown at point 216. At time T6, APD 12e is now at a nominal bias voltage above its breakdown voltage and is ready for a new detection cycle. The dead time of APD 12e, which has been significantly reduced using quench circuits 104e and 106e and reset circuits 110c and 112e, can be calculated by subtracting the time T7 from T0.

Benefits of using the double quench circuit and reset circuits of the subject invention include reduced after pulsing, reduced heating of the APD, and increased maximum count rate and linearity of the APD over prior quench circuits. Also, the maximum incident photons rate of the APD is significantly increased.

Although the high bias voltage is described herein as being a positive voltage in some embodiments, the high bias voltage may be either a high positive or negative voltage as known to those skilled in the art. One such circuit in which the high bias voltage is negative is disclosed in the above mentioned U.S. Pat. No. 5,532,474.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not to be limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A double quench circuit for an avalanche current device, the circuit comprising:
   an avalanche current device having a first terminal responsive to a bias voltage to reverse bias the avalanche current device above its avalanche breakdown voltage;

a first quench circuit responsive to the bias voltage and coupled to the first terminal of the avalanche device for reducing the amount of the avalanche current passing through the avalanche device; and a second quench circuit coupled to a second terminal of the avalanche device for providing a quenching voltage to the second terminal to counteract and reduce the amount of the avalanche current passing through the avalanche device.

2. The double quench circuit of claim 1, further including:
a detection circuit responsive to avalanche current of the avalanche current device for detecting the avalanche current and generating an output signal in response thereto;
the second quench circuit including an active quench circuit responsive to the output signal of the detection circuit for raising the voltage of the second terminal of the avalanche device and reducing the avalanche breakdown voltage to quench the avalanche current of the avalanche device.

3. The double quench circuit of claim 2 in which the second quench circuit includes a switch configured to couple a second voltage to the second terminal to raise the voltage of the second terminal.

4. The double quench circuit of claim 2 in which the detection circuit includes a comparator configured to compare the voltage of the second terminal with a reference voltage and output a signal when the voltage of the second terminal exceeds the reference voltage.

5. The double quench circuit of claim 4 in which the detection circuit includes a delay circuit responsive to the comparator and configured to delay the output of the comparator provided to the second quench circuit.

6. The double quench circuit of claim 1 in which the first quench circuit includes a passive quench circuit.

7. The double quench circuit of claim 6 in which the passive quench circuit includes one or more resistors.

8. The double quench circuit of claim 2, further including:
a first active reset circuit responsive to the output signal of the detection circuit, said active reset circuit configured to couple the first terminal to the bias source to recharge the avalanche device above its avalanche breakdown voltage to reset the avalanche device.

9. The double quench circuit of claim 8 in which the first active reset circuit includes a switch connected between the bias voltage and the first terminal.

10. The double quench circuit of claim 9 in which the switch includes a transistor.

11. The double quench circuit of claim 2, further including:
a second active reset circuit responsive to the output signal of the detection circuit and connected to a second terminal of the avalanche device, said second active reset circuit configured to couple the second terminal to a third voltage to recharge the avalanche device above its avalanche breakdown voltage to reset the avalanche device.

12. The double quench circuit of claim 11 in which the third voltage is ground and the second active reset circuit includes a switch connected between ground and the second terminal.

13. The double quench circuit of claim 12 in which the switch includes a MOSFET transistor.

14. The double quench circuit of claim 5, further including a buffer circuit responsive to the second terminal, the delay circuit and the second quench circuit and configured to transfer signals between the second terminal and both the delay circuit and the second quench circuit.

15. The double quench circuit of claim 1, in which the avalanche device is an avalanche photodiode.

16. The double quench circuit of claim 1, in which the bias voltage is a positive voltage.

17. A double quench circuit for an avalanche photodiode (APD), the circuit comprising:
an avalanche photodiode having a cathode responsive to a bias voltage to reverse bias the APD above its avalanche breakdown voltage;
a detection circuit responsive to avalanche current of the APD for detecting the avalanche current and generating an output signal in response thereto;
a passive quench circuit responsive to the bias voltage and coupled to the cathode of the APD for reducing the amount of the avalanche current passing through the APD; and
an active quench circuit responsive to the detection circuit and coupled to an anode of the APD for providing a quenching voltage to the second terminal to counteract and reduce the avalanche breakdown voltage to quench the avalanche current of the avalanche photodiode.

18. The double quench circuit of claim 17 in which the active quench circuit includes a switch configured to couple a second voltage to the anode to raise the voltage of the anode.

19. The double quench circuit of claim 18 in which the passive quench circuit includes one or more resistors.

20. The double quench circuit of claim 17, further including:
a first active reset circuit responsive to the output signal of the detection circuit, said active reset circuit configured to couple the cathode to the bias voltage to recharge the APD above its avalanche breakdown voltage to reset the APD.

21. The double quench circuit of claim 20 in which the first active reset circuit includes a switch connected between the voltage source and the anode.

22. The double quench circuit of claim 20, further including:
a second active reset circuit responsive to the output signal of the detection circuit and connected to the anode of the avalanche photodiode, said second active reset circuit configured to couple the anode to a third voltage to recharge the avalanche photodiode above its avalanche breakdown voltage to reset the avalanche photodiode.

23. The double quench circuit of claim 22 in which the third voltage is ground and the second active reset circuit includes a switch connected between ground and the anode.

24. A double quench circuit for an avalanche photodiode (APD), the circuit comprising:
an avalanche photodiode having a cathode responsive to a bias voltage to reverse bias the APD above its avalanche breakdown voltage;
a detection circuit including a comparator responsive to avalanche current of the APD and a reference voltage for detecting the avalanche current and generating an output signal in response thereto;
a passive quench circuit including one or more resistors responsive to the bias voltage and coupled to the cathode of the APD for reducing the amount of the avalanche current passing through the APD;
an active quench circuit responsive to the detection circuit and coupled to an anode of the APD for reducing the avalanche breakdown voltage to quench the avalanche current of the avalanche photodiode;
a first active reset circuit responsive to the output signal of the detection circuit, said active reset circuit configured to couple the cathode to the voltage source to recharge the APD above its avalanche breakdown voltage to reset the APD; and a second active reset circuit responsive to the output signal of the detection circuit and connected to the anode of the avalanche photodiode, said second active reset circuit configured to couple the anode to a third voltage to recharge the avalanche photodiode above its avalanche breakdown voltage to reset the avalanche photodiode.

* * * * *